(12) United States Patent
Yang

(10) Patent No.: US 6,213,049 B1
(45) Date of Patent: Apr. 10, 2001

(54) NOZZLE-INJECTOR FOR ARC PLASMA DEPOSITION APPARATUS

(75) Inventor: Barry Lee-Mean Yang, Clifton Park, NY (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 09/033,862

(22) Filed: Mar. 3, 1998

Related U.S. Application Data

(60) Provisional application No. 60/050,837, filed on Jun. 26, 1997.

(51) Int. Cl.[7] .................................................. C23C 4/00
(52) U.S. Cl. ........................ 118/723 R; 118/723 DC; 219/121.47; 219/121.5; 219/76.16
(58) Field of Search ............... 118/723 R, 723 DC; 219/121.47, 121.5, 76.16

(56) References Cited

U.S. PATENT DOCUMENTS

| | | |
|---|---|---|
| 3,892,882 | 7/1975 | Guest et al. . |
| 4,871,580 | 10/1989 | Schram et al. . |
| 4,882,465 | * 11/1989 | Smith et al. . |
| 4,948,485 | 8/1990 | Wallstén et al. . |
| 4,957,062 | 9/1990 | Schuurmans et al. . |
| 5,120,568 | 6/1992 | Schuurmans et al. . |
| 5,278,384 | 1/1994 | Matsuzawa et al. . |
| 5,356,674 | 10/1994 | Henne et al. . |
| 5,358,596 | 10/1994 | Cappelli et al. . |
| 5,406,046 | 4/1995 | Landes . |
| 5,853,815 | 12/1998 | Muehlberger . |

FOREIGN PATENT DOCUMENTS

| | | |
|---|---|---|
| 0223104 | 5/1987 | (EP) . |
| 0394735 | 10/1990 | (EP) . |

OTHER PUBLICATIONS

D.A. Gerdeman and N.L. Hecht, *Arc Plasma Technology In Materials Science,* 1–17 (1972) (no month).

Charles D. Iacovangelo, "Silicon Dioxide Deposition by Plasma Activated Evaporation Process," S.N. 09/059,109, filed Apr. 13, 1998.

Yang et al., "Protective Coating by High Rate Arc Plasma Deposition, " S.N. 09/036,776, filed Mar. 9, 1998.

Charles D. Iacovangelo, "Silicon Dioxide Deposition by Plasma–Activated Evaporation Process", S.N. 60/050,820, filed Jun. 26, 1997.

Yang et al., "Protective Coating by High Rate Arc Plasma Deposition," 60/050,821, filed Jun. 26, 1997.

* cited by examiner

*Primary Examiner*—Deborah Jones
*Assistant Examiner*—Jennifer McNeil
(74) *Attorney, Agent, or Firm*—Robert P. Santandrea; Noreen C. Johnson

(57) ABSTRACT

A nozzle-injector was designed and fabricated for plasma deposition of thin-film coatings using a wall-stabilized arc torch as the plasma generator. The design of the nozzle-injector controls the injection, ionization, and reaction of the reagents, and these functions, in turn, determine the coating deposition rate, coating area, coating composition, and coating quality.

23 Claims, 2 Drawing Sheets

NOZZLE-INJECTOR FOR ARC PLASMA DEPOSITION APPARATUS

This application claims the benefit of U.S. Provisional Application Ser. No. 60/050,837, filed Jun. 26, 1997.

This invention relates to arc plasma deposition of protective coatings on various substrates such as glass, quartz, metal or metallized materials, and plastics; and more particularly to a combined nozzle-injector for directing plasma flow and injecting reactive reagents into the plasma for high rate deposition of transparent coatings which are abrasion resistant, UV absorbing, or IR reflective.

BACKGROUND OF THE INVENTION

The technological importance of thin films has led to the development of a variety of deposition methods.

Chemical vapor deposition (CVD) produces a solid film on a substrate surface by thermal activation and surface reaction of gaseous reagents which contain the desired constituents of the film. Energy required to pyrolyze the reactants is supplied by heating the substrate. For reasonable reaction rates the substrate is heated to relatively high temperatures in the range of about 5000 to 2000° F. degrees. These temperatures preclude application of the process to heat sensitive substrate materials.

Plasma enhanced chemical vapor deposition (PECVD) supplies energy to the reactants by an electrical discharge in a gas which forms a plasma in the deposition chamber. Generally the substrate is immersed in the plasma. The deposition rate is usually low.

Polycarbonate is often the engineering material of choice for glazing and optical applications because of its high impact strength, low density, optical clarity, and good processibility. However, the polycarbonate material is soft, lacks glass-like abrasion resistance, and is sensitive to temperatures above about 300° F. Prior work had shown that a silicon oxide coating by plasma-enhanced chemical vapor deposition (PECVD) can improve the abrasion resistance of polycarbonate, qualifying it for glazing applications. However, the prior PECVD technology using silane and nitrous oxide as the precursors was slow and therefore uneconomical, having a typical deposition rates of only about 0.05 microns per minute. Organosilicon precursors were later used in PECVD for a plasma-generated abrasion-resistant polymer coating, but the deposition rate was not significantly improved.

The process of this invention provides coatings and layers which impart improved adhesion, thermal expansion compatibility, radiation protection, or abrasion resistance to articles or products made by the deposition process of the invention. The deposition of such protective coatings by plasma on high and low temperature materials in the form of sheets, films, and shaped substrates can be achieved by the apparatus and methods disclosed herein.

SUMMARY OF THE INVENTION

A nozzle-injector was designed and fabricated for plasma deposition of thin-film coatings using a wall-stabilized arc torch as the plasma generator. The design of the nozzle-injector controls the injection, ionization, and reaction of the reagents, and these functions, in turn, determine the coating deposition rate, coating area, coating composition, and coating quality. Using the nozzle-injector of this invention with oxygen and a siloxane as the reagents, clear coatings at a deposition rate of about 30 microns per minute, at the center, were demonstrated on polycarbonate and glass substrates. The siloxane-derived coating greatly improved the abrasion resistance of a polycarbonate substrate. By substituting appropriate organometallic reagents for the siloxane, other oxide coatings, such as zinc oxide or titanium oxide, were also deposited on a plastic substrate. Such coatings are useful as infrared or ultraviolet protective coatings. The nozzle-injector of this invention combines in a single device the direction control function of a nozzle with the reactant introduction function of one or more injectors.

Organosilicon compounds useful as monomers in the arc plasma deposition process using the nozzle-injector of this invention include silane and other silicon compounds in which at least one silicon atom is bonded to at least one carbon or one hydrogen atom such as siloxanes, silazanes and organosilicones.

DESCRIPTION OF THE INVENTION

The disclosed nozzle-injector is suitable for use with a variety of plasma generating apparatus such a wall stabilized arc plasma torch having at least one water cooled electrically isolated plate located between the cathode and the anode. Multi plate wall-stabilized arc devices are described in U.S. Pat. Nos. 4,948,485 and 4,957,062.

The cascaded arc with multiple plates has been used as a plasma source for making diamond-like carbon and plasma-polymerized coatings from hydrocarbon and organosilicon reagents, respectively. Deposition rates of a few micrometers per minute were reported. However, the coating area was small, a few centimeters in diameter, and the degree of material utilization was low, less than about 20%. Depending on the conditions, powder or powdery coatings could also be formed outside of the central deposition zone. To make the coating technique practical and economical, it is critical to enlarge the coating area, to increase the deposition rate, and to minimize powder formation. The nozzle injector of this invention accomplishes those improvements.

The nozzle-injector was designed to improve coating performance of wall stabilized arc plasma generators for use in low temperature plasma deposition and polymerization methods. Shower-ring or slit-ring injectors were built into the nozzle for the delivery of gas or vapor reagents. The locations of the injectors affect the degree of gas ionization, which affects the extent of reaction, and hence the chemical stoichiometry and structure of the coating, and ultimately its performance. The shape and the size of the nozzle-injector also affect the extent of reaction, the coating area, and the thermal load on the substrate. With this nozzle-injector, optically clear coatings 30 cm×30 cm in area were deposited at a rate of about 30 microns per minute at the center. Without such a nozzle-injector powdery coatings formed.

The nozzle-injector, configuration and structure included both cylindrical and conical plasma channels and a 2-stage conical channel with a cylindrical section in between. The divergent angle of the conical channel of the nozzle-injector ranged from about 0 to 60°. The opening of the plasma channel at the base of the nozzle ranged from about 4 to 7 mm in diameter. Smaller diameter channels can be used for coating small objects. The length of the nozzle-injector ranged from 1.5 to 25 cm thereby controlling the volume of the zone in which reaction can take place. The nozzle-injector can be a single integral construction or can be assembled from parts such as a stainless steel main body with injectors for introducing reagents into the plasma, a copper adapter for mounting the nozzle-injector to the plasma generator, and a extension attached to the downstream end of the main body to provide a suitable volume for the reaction zone which exists within the nozzle-injector. An injector can be built into the copper adapter for oxygen injection, and the copper adapter was gold-plated to resist oxidation. The modular design of the nozzle-injector allows the effect of nozzle size and gas injection position eliminates the need for separate direction control and reagent injection units.

DESCRIPTION OF THE DRAWING

Figure 1:
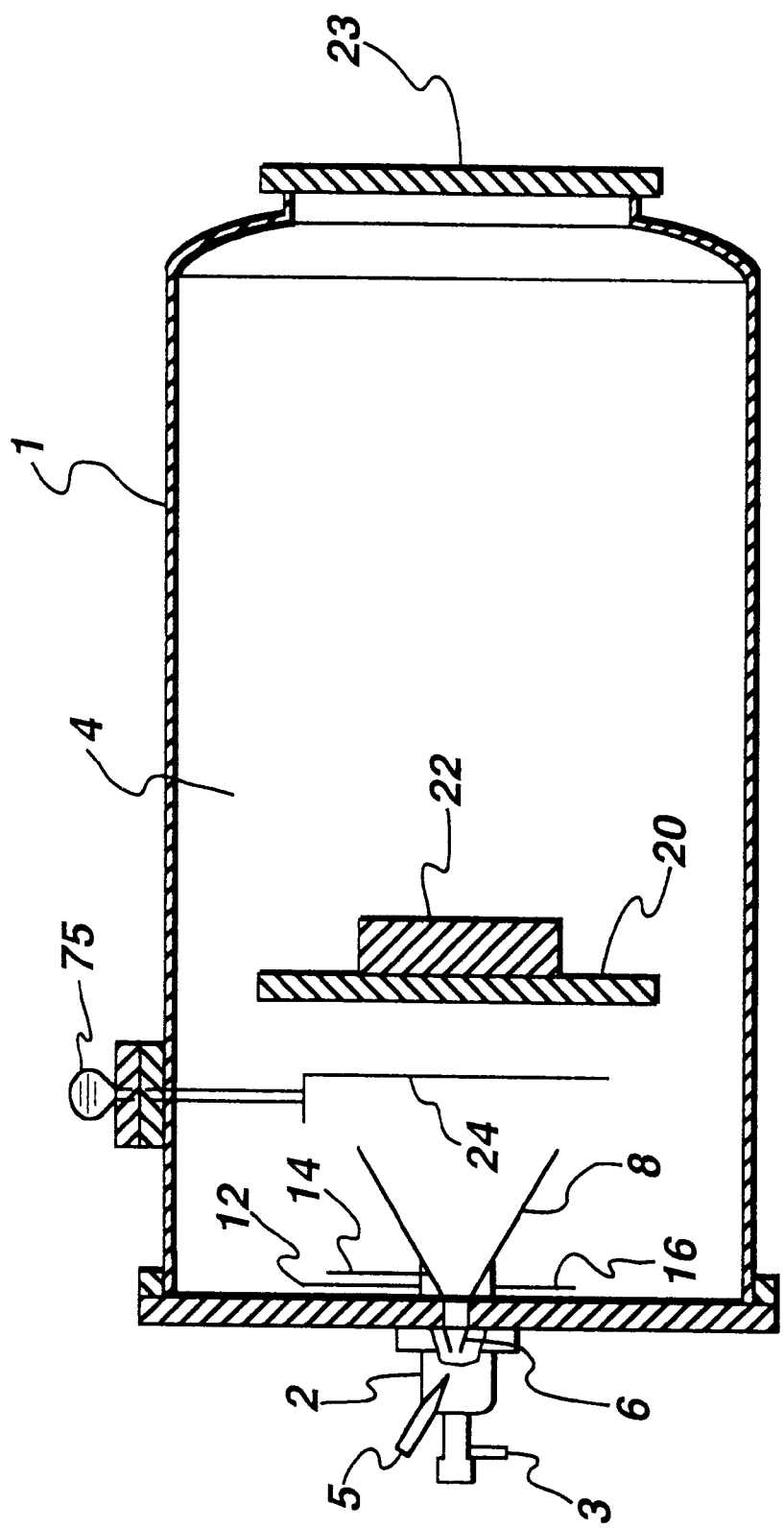
FIG. 1 is schematic cross-section of a plasma arc deposition system which includes a vacuum chamber, a plasma generator, and the nozzle-injector of the invention.

Referring now to FIG. 1, the arc plasma coating system illustrated schematically comprises a vacuum chamber reactor 1, which includes a plasma generator 2, plasma treatment chamber 4, plasma inlet 46, and nozzle-injector 48. The plasma generator is supplied with the plasma gas such as argon via gas supply line 3. Nozzle-injector 48 is provided with oxygen supply line 12 and a pair of reagent supply lines 14 and 16 which can be operated individually or in combination. A vacuum pumping system, not shown, maintains low pressure within the plasma treatment chamber 4 via outlet 23. The substrate to be coated 20 is supported in the plasma treatment chamber on a temperature controlled support 22. A retractable shutter 44 is adapted for manual positioning by handle 25 or automatic positioning between the substrate and the nozzle in the path of the plasma jet.

Figure 2:
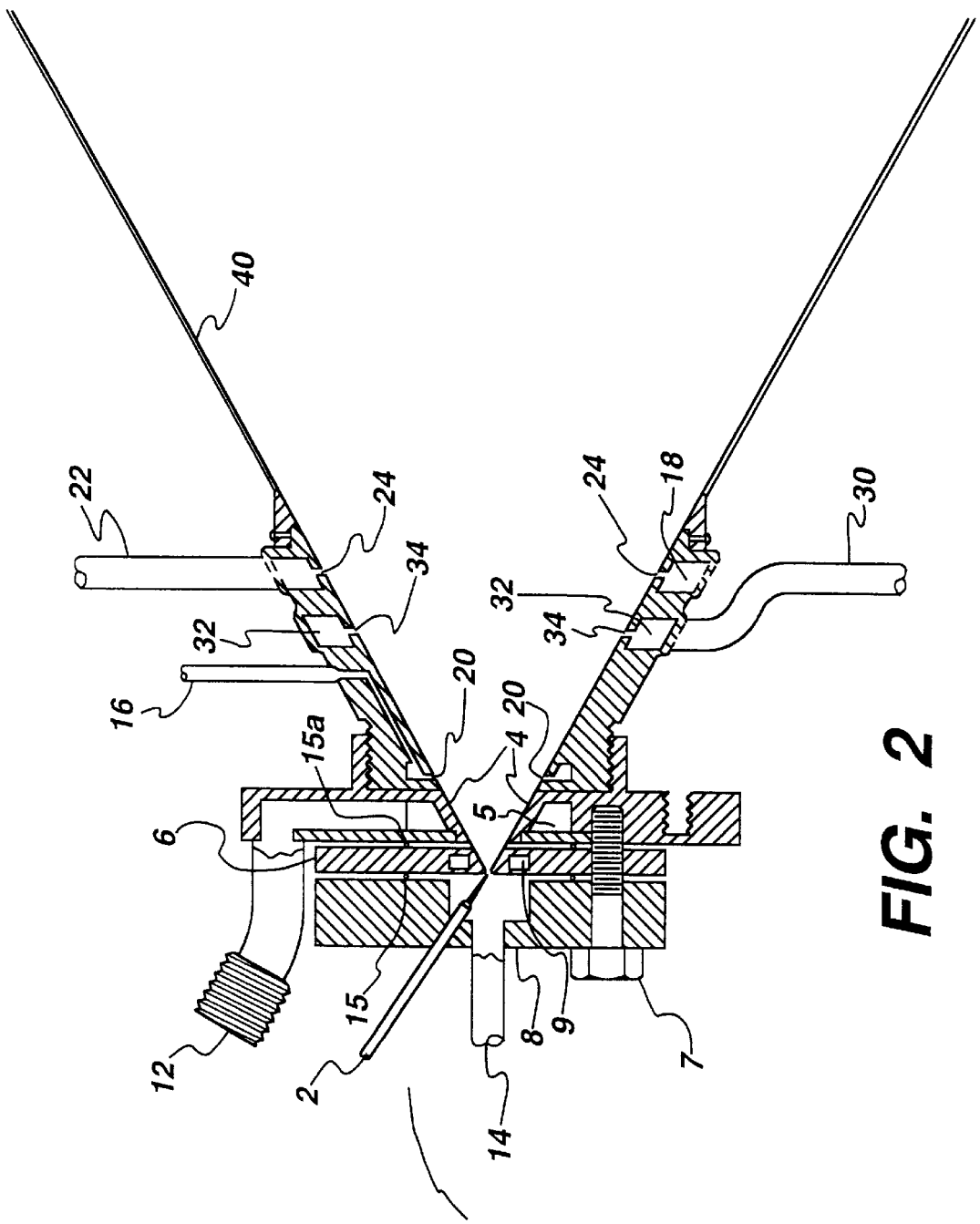
FIG. 2 is a cross-section view of a plasma generator and a nozzle-injector according to the invention.

Referring to FIG. 2, the plasma is generated by a current of electrons flowing from the cathode 42 to water cooled anode 4 through an electrically isolated cascade plate 6 which has a central gas plasma channel of divergent configuration. The device is provided with a plurality of equally spaced apart cathodes, only one shown as 42. The cathodes are water cooled. The cathodes are mounted in cathode housing 8 which is mounted on a water cooled copper plate 6. Plate 6 is electrically isolated. Cooling water channel 9 is supplied via water line, not shown. Cooling water for anode 4 is supplied by water line 12 and flows through conduit 5 within the body of the anode. The vacuum within the treatment chamber is maintained in part by sealing O-rings 15 and 15a.

The plasma gas, e.g., argon, is supplied to the plasma generator through gas line 14. Oxygen is supplied to the nozzle through line 16 which communicates with circular conduit 18 and a slit injector 20. The reactive reagent is supplied via line 22 which feeds conduit 24 and evenly spaced injection holes 26. As illustrated the nozzle has a secondary reagent supply line 30 connecting with conduit 32 and injection holes 34. The secondary supply system can be used to feed another reactive gas or diluent gas to the activation or reaction zone within the nozzle-injector.

The nozzle-injector includes a divergent portion 40 for directing the plasma and reactive species towards the substrate surface to be coated. Portion 40 can be an integral part of the nozzle unit or it can be designed as a removable extension. As shown, the extension has the same degree of divergence as the part of the nozzle immediately adjacent the anode. The extension can vary from the shape and geometry of the anode plasma channel and the adjacent portion of the nozzle-injector, for example by having a flared or bell shaped mouth.

Securing screw 7 is one of several used to mount the cathode housing to plate 6 and anode 4.

The invention provides apparatus for surface treatment and deposition of an optically clear adherent coating on a substrate surface by reactants injected into a plasma which comprises a plasma generator having one or more cathodes and at least one anode, a treatment chamber operable at sub-atmospheric pressures, substrate support means located within the treatment chamber to support the substrate, vacuum pumping means communicating with the treatment chamber for evacuating the treatment chamber to sub-atmospheric pressure, a nozzle-injector device mounted on the anode end of the plasma generator for directing the plasma jet towards the substrate and delivery of the reagents into the plasma within the nozzle-injector.

The nozzle-injector comprises reagent delivery means for injecting reagents into the plasma as the plasma emerges from the plasma generator.

The nozzle-injector is generally conical with the wide end directed towards the substrate. The degree of divergence and the length of the nozzle determine the volume enclosed within the device. This in turn determines the time available for reaction and formation of the active species which treat or coat the surface of the substrate.

Reagent delivery means for injecting reagents into the plasma are located at the narrow end of the nozzle-injector and include at least two separate annular injection conduits and distribution means for uniform introduction of reagents into the plasma.

Usually the nozzle-injector extends from the anode end of the plasma generator into the treatment chamber. However the nozzle-injector device could be mounted on the anode end of the plasma generator outside the vacuum chamber communicating with the interior of the vacuum via a suitable vacuum tight seal.

EXPERIMENTAL

A water-cooled cascaded arc was used as the plasma generator. The arc generator includes a copper anode separated from three needle-cathodes of thoriated tungsten by at least one or a series of electrically isolated copper disks. With argon flowing through the bore of the arc torch, a DC voltage is applied to the electrodes to generate a plasma. The plasma expands through the nozzle-injector into a chamber at a reduced pressure maintained by a vacuum pump, thus forming a plasma jet. The nozzle-injector is heated to about 200° C. to avoid condensation of the high boiling point organosilicon reagents. The substrate to be coated is supported on the jet axis by means of a metal stage at a suitable working distance, e.g., about 15 to 70 cm from the anode. A retractable shutter is used to regulate the exposure of the substrate to the plasma.

In a typical deposition procedure the argon plasma is established with the shutter in place between the substrate and the nozzle-injector. Oxygen is introduced to the nozzle-injector to produce an oxygen/argon plasma. The shutter was retracted and the substrate was exposed to the oxygen/argon plasma for a short time before the silicon-containing reagent is introduced downstream from the oxygen injection site to initiate deposition.

In Table 1 the effects of nozzle-injector on coating area, deposition rate, and the Taber abrasion resistance of the coating are compared. Coatings were about 2 microns thick. It was found that a conical nozzle-injector (G273, G241) is most effective for large-area coatings. Without such a nozzle-injector, powders or powdery coatings were generally obtained.

TABLE 1

Effect of Nozzle-Injector on Coating Performance

|  | G273 | G241 | G187 | G204 | G147 | G123 |
|---|---|---|---|---|---|---|
| Nozzle-injector type[a] | conical | conical | conical | conical | con-cyl-con | con-cyl |
| Divergent angle (degree) | 40 | 40 | 25 | 25 | 33 | 50 |
| Cylindrical section dia (cm) | — | — | — | — | 1.1 | 3.0 |
| Total nozzle length (cm) | 16 | 16 | 21 | 13.5 | 13.5 | 9.5 |
| Oxygen feed position[b] (cm) | 0.5 | 0.5 | 4 | 4 | 4 | 4.5 |
| Siloxane feed position[b] (cm) | 5 | 5 | 5 | 5 | 5 | 6 |
| Working distance[c] (cm) | 25.5 | 25.5 | 33 | 23 | 38 | 38 |
| Substrate | MR7 | Glass | MR7[e] | MR7[e] | PC | MR5[e] |
| Si reagent[d] | D4 | TMDSO | TMDSO | TMDSO | HMDSO | HMDSO |
| Argon flow rate (l/min) | 1.0 | 1.0 | 1.5 | 1.5 | 2.0 | 2.0 |
| Oxygen flow rate (l/min) | 0.8 | 0.8 | 0.8 | 0.8 | 0.06–0.6 | 0–0.93 |
| Siloxane flow rate (l/min) | 0.27 | 0.18 | 0.18 | 0.18 | 0.11 | 0.18 |
| Chamber pressure (torr) | 0.15 | 0.15 | 0.15 | 0.15 | 0.18 | 0.22 |
| Deposition rate (μm/min) | 29 | 9 | 10 | 10 | 4 | 10 |
| Area of clear coating (cmdia) | 43 | 43 | 15 | 7.5 | 10 | 7.5 |
| ΔHaze at 1,000 cycle (%) | 3 | — | 7 | 3 | 6 | 10 |

[a]conical, conical-cylindrical-conical, or conical-cylindrical
[b]distance from anode
[c]distance between substrate and anode
[d]D4 = octamethylcyclotetrasiloxane, TMDSO = tetramethyldisiloxane, HMDSO = hexamethyldisiloxane
[e]polycarbonate with a silicone hardcoat layer
Working distance is the distance from anode to substrate.
D4 flow rate was controlled by keeping the liquid temperature constant at 80° C.

In particular experiments described above, the nozzle-injector comprises a main body with two showerhead injection rings, an adapter for mounting the nozzle-injector to the anode and injecting oxygen into the plasma, and an extended portion that expands toward the substrate. The 25° 2-stage is a nozzle-injector with an anode adapter injector expanding from 4 to 11 mm, followed by a cylindrical section at 11 mm diameter, and a main body expanding at 25°. The 25°-4 inch conic is a nozzle-injector expanding at an angle of 25° throughout, with an oxygen injection adapter, and a conic extension 4" long. The 40°-4 inch conic is a nozzle-injector expanding at 40° throughout, with an anode adapter with oxygen injection and a conic extension 4 inches long. The 40°-4 inch trombone is a nozzle-injector similar to the 40°-4" conic except that the extension flares out more by using a 4 inch section cut out from the bell of a trombone.

What is claimed is:

1. A deposition apparatus comprising:
    a cathode;
    an electrically conductive cascade plate having an aperture;
    an anode having an aperture which diverges in a flow direction; and
    a nozzle having an aperture which diverges in the flow direction and extends from the anode.

2. The deposition apparatus of claim 1, wherein the cascade plate aperture diverges in the flow direction.

3. The deposition apparatus of claim 2, herein the cascade plate aperture, the anode aperture, and the nozzle aperture are conical.

4. The deposition apparatus of claim 1, wherein the nozzle includes an inlet through which a reagent can flow.

5. The deposition apparatus of claim 1, wherein the nozzle includes first and second inlets through which first and second reagents can flow.

6. The deposition apparatus of claim 5, wherein the first and second inlets are in the form of a plurality of holes or slits in a ring configuration.

7. The deposition apparatus of claim 5, wherein the nozzle includes a third inlet through which oxygen flows.

8. The deposition apparatus of claim 7, wherein the third inlet is closer to the anode than the first and second inlets.

9. A deposition apparatus comprising:
    a cathode;
    an anode having an aperture which diverges in a flow direction; and
    a nozzle having an aperture which diverges in the flow direction;
    wherein the nozzle includes an inlet formed on an inner surface of the nozzle, and the inlet is located closer to the anode than to a divergent end of the nozzle.

10. The deposition apparatus of claim 9, wherein the inlet is configured to direct a gas toward a central axis of the deposition apparatus.

11. The deposition apparatus of claim 9, wherein the inlet comprises a plurality of holes or slits spaced around the inner surface of the nozzle.

12. The deposition apparatus of claim 9, further comprising a second inlet formed through the inner surface of the nozzle.

13. The deposition apparatus of claim 9, further comprising a third inlet formed through the inner surface of the nozzle.

14. The deposition apparatus of claim 9, wherein the nozzle has a length of between 1.5 and 25 centimeters.

15. A deposition apparatus comprising:
    a cathode;
    an anode; and
    a diverging nozzle having first and second inlets;
    wherein a length of the nozzle is more than three times a distance from the anode to the first inlet; and
    wherein the length of the nozzle is more than two times a distance from the anode to the second inlet.

16. The deposition apparatus of claim 15, wherein the first inlet is between 0.5 and 4.5 centimeters from the anode.

17. The deposition apparatus of claim 15, wherein the second inlet is between 5 and 6 centimeters from the anode.

18. The deposition apparatus of claim 15, wherein the nozzle has a length of between 13.5 and 21 centimeters.

19. The deposition apparatus of claim 18, wherein the nozzle has a divergence angle of less than or equal to 60 degrees.

20. The deposition apparatus of claim 15, wherein the nozzle has a divergence angle of 25–40 degrees.

21. A deposition apparatus comprising:

a cathode;

an electrically conductive cascade plate having a conical aperture which diverges in a flow direction; and an anode.

22. A deposition apparatus comprising:

a cathode;

an anode having an aperture which diverges in a flow direction; and a nozzle injector, extending from the anode, having inner walls which diverge in a flow direction, the nozzle injector further comprising at least one ring-shaped conduit having holes in fluid communication with the inner walls through which holes a gaseous reactant flows into a plasma.

23. The deposition apparatus of claim 22, wherein the anode has inner walls which diverge immediately downstream of the one or more cathodes.

* * * * *